United States Patent [19]

Anderson, Jr. et al.

[11] Patent Number: 5,140,603
[45] Date of Patent: Aug. 18, 1992

[54] OVERMODULATION PROTECTION FOR AMPLITUDE MODULATED LASER DIODE

[75] Inventors: Wayne Anderson, Jr., Dacula; Frederick T. Zendt, Norcross; Rezin E. Pidgeon, Jr., Atlanta; Grover Martin, Stone Mountain, all of Ga.

[73] Assignee: Scientific-Atlanta, Inc., Atlanta, Ga.

[21] Appl. No.: 518,024

[22] Filed: May 2, 1990

[51] Int. Cl.$^5$ .............................................. H01S 3/00
[52] U.S. Cl. .................................... 372/38; 372/26; 372/29; 372/31
[58] Field of Search ...................... 372/38, 26, 31, 29

[56] References Cited

U.S. PATENT DOCUMENTS

| | | | |
|---|---|---|---|
| 4,237,427 | 12/1980 | Holland | 331/94.5 |
| 4,369,525 | 1/1983 | Breton et al. | 455/618 |
| 4,399,566 | 8/1983 | Roullet et al. | 455/613 |
| 4,476,512 | 10/1984 | Sunago | 361/103 |
| 4,553,268 | 11/1985 | Tilly | 455/607 |
| 4,612,671 | 9/1986 | Giles | 372/38 |
| 4,631,728 | 12/1986 | Simons | 372/38 |
| 4,698,817 | 10/1987 | Burley | 372/31 |
| 4,733,398 | 3/1988 | Shibagaki et al. | 372/31 |
| 4,789,987 | 12/1988 | Fraser | 372/31 |
| 4,796,996 | 1/1989 | Burns | 356/372 |
| 4,806,873 | 2/1989 | Nagano | 372/38 |
| 4,837,787 | 6/1989 | Takesue | 372/29 |
| 4,924,473 | 5/1990 | Burgyan et al. | 372/38 |
| 4,950,268 | 8/1990 | Rink | 606/12 |

FOREIGN PATENT DOCUMENTS

| | | |
|---|---|---|
| 59-4346 | 1/1984 | Japan . |
| 60-96040 | 5/1985 | Japan . |
| 62-1106029 | 5/1987 | Japan . |
| 62-245826 | 10/1987 | Japan . |

Primary Examiner—Georgia Y. Epps
Attorney, Agent, or Firm—William A. Marvin

[57] ABSTRACT

A laser diode protection circuit which monitors the r.f. modulation level of the input modulating signal to the laser diode and disconnects the laser diode from the r.f. modulating signal when it exceeds an acceptable level. The circuit further monitors the output of the d.c. power supply which provides the d.c. bias current to the laser diode. The circuit disconnects the laser diode from the r.f. modulating signal when the output of the power supply falls below an acceptable level.

17 Claims, 2 Drawing Sheets

OVERMODULATION PROTECTION FOR AMPLITUDE MODULATED LASER DIODE

This invention relates to optical signal generation by a laser and more specifically to an apparatus for use in connection with an amplitude modulated laser diode to protect the laser diode from damage resulting from overmodulation.

BACKGROUND

Laser diodes which exhibit a relatively linear relationship between input current and optical output have recently come into extensive use in connection with the transmission of broadband video signals over fiber optic transmission paths. In such systems, the input current signal feeding a laser diode may be amplitude modulated with a broadband radio frequency signal comprising a plurality of radio frequency channels. Each of these r.f. channels is in turn modulated with a baseband video signal. Laser diodes having characteristics which are sufficiently linear to serve as devices for converting such amplitude modulated input signals into corresponding amplitude modulated optical signals are quite expensive. It is a characteristic of suitable laser diodes which are presently available that supplying these devices with input signals having magnitudes outside of a specified range may cause damage to them. At least two factors may influence the magnitude of the input signal to the laser diode to exceed acceptable limits. Firstly, if the peak-to-peak magnitude of the r.f. signal becomes too great, the negative excursion of the signal may be outside the safe operating range of the laser. Even if the r.f. input signal is maintained at an acceptable level, the safe operating range of the laser may still be exceeded if the d.c. bias current to the laser diode is lost. Such a loss of d.c. bias current may occur, for example, as a result of a defect in the power supply which produces the d.c. bias current.

A number of circuits have been proposed for regulating the peak-to-peak amplitude of input signals to a laser diode. Typically, however, these circuits are adapted for maintaining the input signal range within the linear operating range of the laser diode characteristic. These circuits are not specifically adapted, however, to protect the laser diode in the event that its input signals exceed an acceptable magnitude. The circuits also do not protect the laser in the even that the magnitude of the input signals exceed a safe value because of, for example, a loss or reduction of input bias current.

SUMMARY OF THE INVENTION

The present invention provides protection for the laser diode by means of a circuit which monitors the r.f. modulation level of the input signal to a laser diode and disconnects the laser diode from the input modulation signal if the r.f. modulation exceeds an acceptable level. The circuit also monitors the output of the d.c. power supply which provides the d.c. bias current to the laser diode and disconnects the laser diode from the input modulating signal if the output of the power supply falls below an acceptable level.

The overmodulation control circuit includes a detector which receives the r.f. input and acts as a lowpass filter to produce a low level (e.g., 150–250 millivolts) d.c. output. This d.c. output represents the total r.f. modulation level of all of the r.f. channels comprising the input modulating signal to the laser diode. The d.c. signal representing the r.f. modulation level is compared in a comparator to a reference signal having a predetermined value to determine whether the r.f. modulation level of the input signal is excessive. In the event that the r.f. modulation level is too high, the comparator circuit produces a signal which causes a single-pole-single-throw switch in the input circuitry of the laser diode to go to an open position thereby protecting the laser diode by preventing the r.f. modulating signal from driving it.

A second portion of the protection circuit monitors the voltage of the power supply which produces the d.c. bias current to the laser diode. If the voltage from the power supply drops below a predetermined level, another comparator circuit produces a signal which also causes the single-pole-single-throw switch in the r.f. input circuit of the laser diode to open, thereby protecting the laser diode.

It is an object of the present invention, therefore, to provide means for detecting an excursion of an input modulating signal to a laser diode beyond limits which are safe for the operation of the laser diode.

It is another object of the present invention to detect losses of power which may prove damaging to a laser diode.

It is yet another object of the present invention to provide circuitry to disconnect a laser diode from its driving circuitry in the event that the level of the input signal being produced by the input circuitry exceeds acceptable limits or in the event of a loss of power which can prove damaging to the laser diode.

Other objects and advantages of the present invention will be apparent from a reading of the specification and appended claims in conjunction with the drawings wherein:

DETAILED DESCRIPTION

Figure 1:
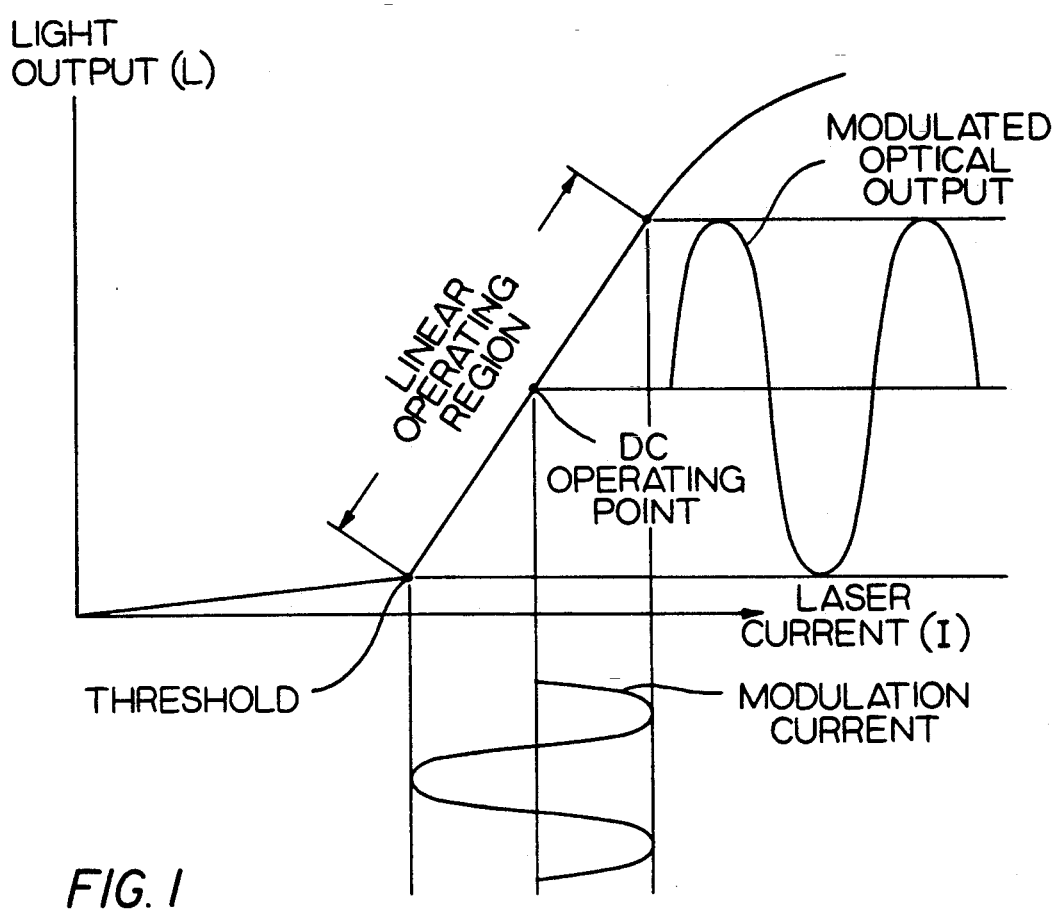
FIG. 1 is a graph illustrating characteristics of a laser diode.

Semi-conductor lasers or laser diodes which are suitable for producing amplitude modulated optical signals for optical fiber communication of video have input current versus optical output characteristic such as that shown in FIG. 1. The laser threshold or diode knee is the input current level at which the device begins to behave as a laser. Below the threshold, the optical output spectrum of light is broader than that defined as a laser and will cause dispersion of light in an optical fiber. Operation of a laser diode in the region below the threshold can cause damage to the device.

In laser diodes suitable for amplitude modulating optical signals with analog input signals, there is a region just above the threshold in which the relationship between laser input current to optical output is essentially linear. For analog amplitude modulation it is particularly important that operation of the laser diode be confined to this "linear operating region" since various types of distortion (e.g., harmonic and/or intermodulation) will be introduced into the modulated optical output if the input signal to the laser diode is allowed to stray outside of this linear region. In order to accomplish this goal, a bias current is applied to the input of the laser to provide a d.c. operating point which is approximately mid-way between the laser threshold and the upper limit of linear operation of the laser. Thus, two distinct signals are applied to the input of the laser during operation. A d.c. bias current which provides a d.c. operating point in the center of the linear operating region and a modulation current signal which is converted to the modulated output by the laser.

In order to prevent damage to the laser diode two requirements must be satisfied. Firstly, the d.c. operating point must not be allowed to reach a level low enough for the most negative excursions of the modulation current signal to extend below the laser threshold. Such a lowering of the d.c. operating point could occur, for example, if the power supply providing the d.c. bias current to the laser were to turn off or become defective. The second requirement is that, with the d.c. operating point maintained in its proper position, the peak-to-peak amplitude of the modulation current should not be allowed to become great enough for the negative excursions of the modulation current to extend below the laser threshold.

Figure 2:
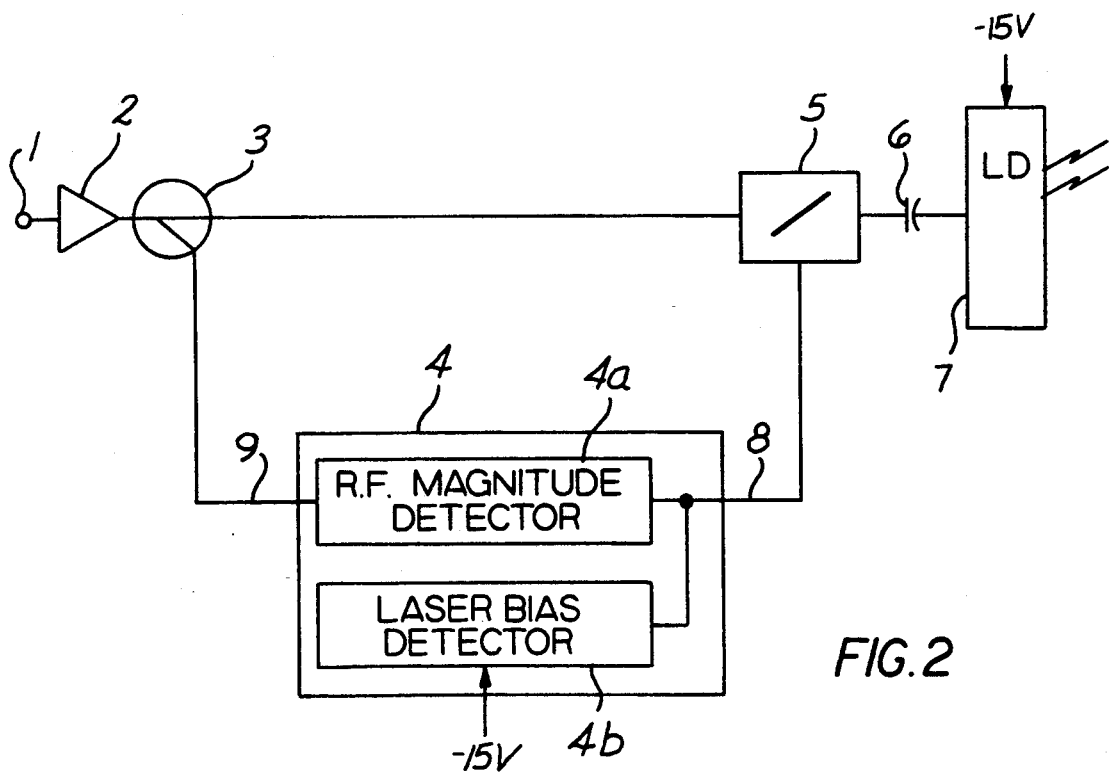
FIG. 2 is a block diagram of the protection circuit of the present invention.

Referring to FIG. 2 there is shown a simplified block diagram of a circuit adapted to amplitude modulate an optical signal with a broadband radio frequency signal. This circuit has the protection provisions discussed above. The broadband r.f. signal enters the circuitry at terminal 1 and is amplified by a broadband radio frequency amplifier 2. The output of the amplifier 2 is fed through a tap circuit 3 to an r.f. switch 5. The r.f. tap circuit is conventional which is, for example, attenuated 10 db, 14 db or 17 db down from the level of the main signal. The switch 5 is a suitable radio frequency single-pole-single-throw (SPST) such as the Omron model G5Y-1 which is adapted to open or close an r.f. signal path depending upon the state of a d.c. input signal. The output of the switch 5 is connected to the control input of a laser diode 7 which in a preferred embodiment of the invention, has an input bias current supplied by a −15 volt power supply. The connection between the switch 5 and the laser diode 7 is through a suitable capacitor 6 which serves to eliminate any d.c. bias voltage from being fed through the r.f. signal path to the control input of the laser 7. The r.f. signal tapped from the tap circuit 3 is fed to an r.f. magnitude detector 4a in a laser protection circuit 4. The −15 volt power supply signal is fed to a laser bias detection 4b of this laser protection circuit 4. In the event that either the −15 volt supply drifts away from acceptable limits or is lost or the amplitude of the r.f. signal to the r.f. magnitude detector 4a exceeds acceptable limits, a signal is produced at the output terminal 8 of the protection circuit 4 which is fed to the switch 5. This signal causes the switch 5 to open so as to remove all input signals from the laser 7 thereby protecting the laser 7 from damage.

Figure 3:
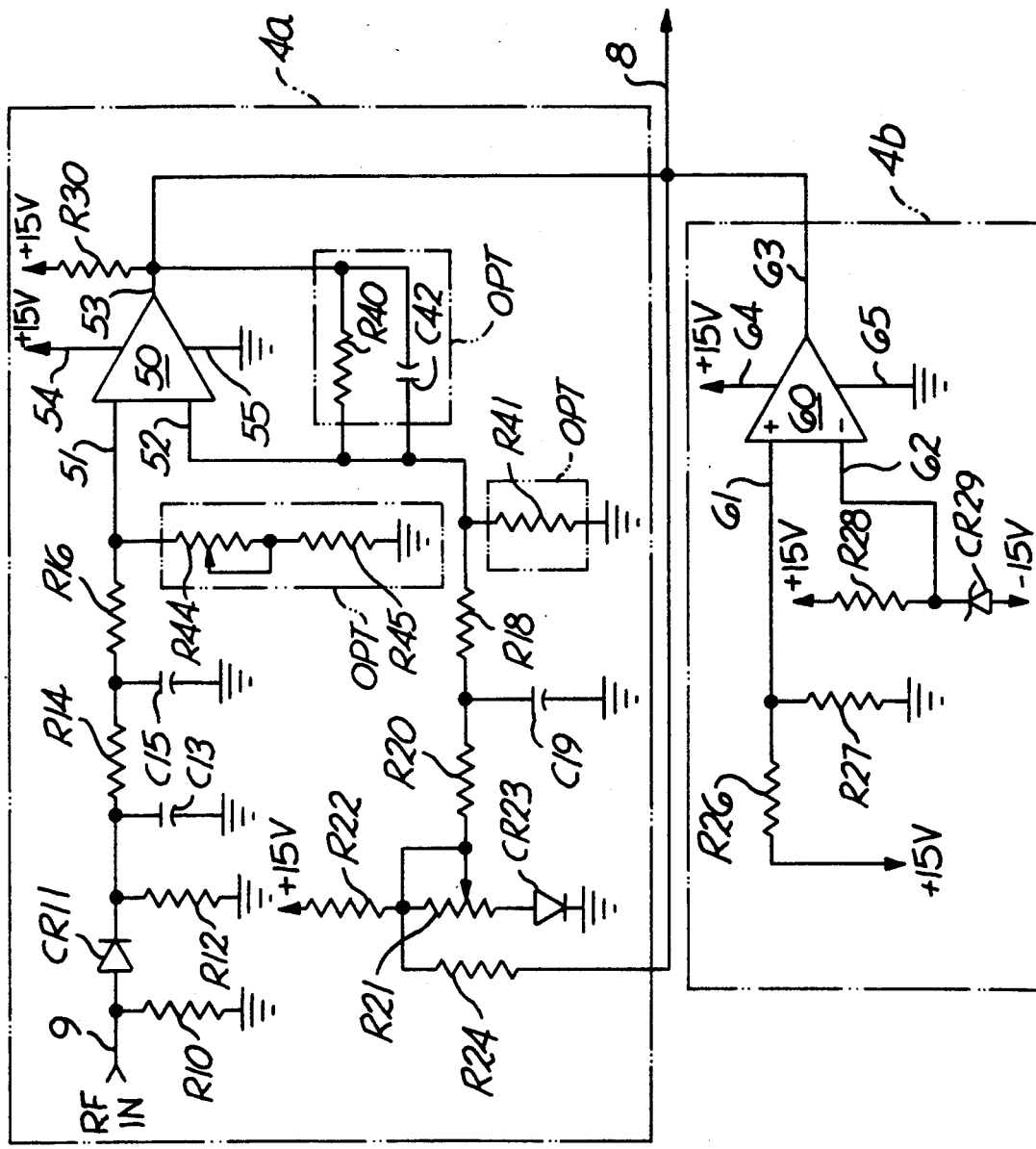
FIG. 3 is a circuit diagram of the r.f. modulation level detection circuitry and power supply monitoring circuitry of the present invention.

Referring to FIG. 3 there is shown a preferred and equally illustrative embodiment the detection circuit 4 of the present invention.

The r.f. signal from the tap circuit 3 is fed to the input terminal 9 of the detector circuit and fed to the input of a Schottky diode CR11. The input of the Schottky diode CR11 is also connected to ground through a resistor R10. The output of the Schottky diode CR11 is connected to a lowpass filter circuit comprising a resistor R12 connected to ground in parallel with a capacitor C1 and a series resistor R14. The other side of resistor R14 is connected to ground through a capacitor C15. Resistor R14 is also connected to the inverting input terminal 51 of a comparator circuit 50 through a resistor R16. In the preferred embodiment the comparator circuit is a type LM 193 manufactured by National Semiconductor. Similar circuits are manufactured by Motorola and other manufacturers.

The noninverting input terminal 52 of the comparator circuit 50 is connected to a resistor R18. The other side of the resistor R18 is connected to ground through a capacitor C19 and to a resistor R20. The other side of the resistor R20 is connected to the tap and to the tap end of a variable resistor R21, thus setting up the resistor R21 to act as a rheostat. The tap end of R20 is also connected to a +15 volt power supply via a resistor R22. The other side of the variable resistor R21 is connected to ground through a Schottky diode CR23. Finally, the bottom of the point of connection of resistor R21 to resistor R22 is also connected to the output of the circuit through a resistor R24.

The laser bias detector 4b of the laser protection circuit 4 includes a comparator circuit 60 which is identical to the comparator circuit 50 discussed above. A negative input terminal 61 of the comparator circuit 60 is connected to ground through a resistor R27 and to the +15 volt power supply through a resistor R26. The negative input terminal 62 of the comparator circuit 60 is connected to the +15 volt power supply through a resistor R28 and to the −15 volt power supply through diode CR 29. The respective output terminals 53 and 63 of comparator circuits 50 and 60 are connected to the +15 volt power supply through a resistor 30.

In addition to the circuits discussed above, the detector may also have the following optional components which are not, however, included in the presently preferred embodiment. These components include a variable resistor R44 in series with a resistor R45 connecting the input terminal 51 of comparator 50 to ground. When these components are used, a resistor R41 should also be used to connect the input terminal 52 of comparator 50 to ground. Additionally, a resistor R40 connected in parallel with a capacitor C42 may be used to connect the output terminal 53 of the comparator 50 to the input terminal 52 of the comparator in order to provide hysteresis for the circuit. The foregoing optional components will be discussed in greater detail below in connection with the discussion with the operation of the circuitry.

In the presently preferred embodiment the component values of the above components are as follows:

| Components | Values |
| --- | --- |
| CR11–CR23 | HP 5082-2836 or similar |
| R14 | 10K 5% ¼ watt |
| R16 | 1.1K 5% ¼ watt |
| R21 | 20K potentiometer |
| R12 | 300K 5% ¼ watt |
| C13 | 470pF 100v. 5% |
| C15 | .1yF 50v. |
| switch 5 | OMRON G5Y-1 or similar |
| R44 | 100K |
| R45 | 100K 5% ¼ watt |
| R30 | 7.5K 5% ¼ watt |
| R40 | 200K–500K 5% ¼ watt |
| C42 | 1–10pF |
| R22 | 270K 5% ¼ watt |
| R24 | 100K 5% ¼ watt |
| R20 | 10K 5% ¼ watt |
| R18 | 1.1K 5% ¼ watt |
| C19 | .1yF 50v. |
| R41 | 270K 5% ¼ watt |

-continued

| Components | Values |
| --- | --- |
| R26 | 5.1K 5% ⅛ watt |
| R27 | 10K 5% ⅛ watt |
| R28 | 620 ohm 5% ⅛ watt |
| CR29 | 1N4747A 20v. 5% zener |
| comparators 50, 60 | LM 193, National Semiconductor |

The operation of the above described circuitry is as follows. The r.f. tap 3 of FIG. 2 provides a suitably attenuated r.f. signal from the main r.f. signal path to the input terminal 9 of the laser protection circuit 4. Depending on the selection of the value of the r.f. tap this signal may be attenuated to a level, for example, which is 10, 14 or 17 db down from the main signal. The resistor R21 connected to the input terminal 9 provides an impedance match between the laser protection circuit 4 and the radio frequency signal path conveying the input signal to it. The Schottky diode CR11 acts as a detector of the total level of r.f. modulation by rectifying the r.f. signals fed to it. These rectified r.f. signals are fed through a lowpass filter comprising resistor R12, resistor R14, resistor R16, capacitor C13 and the capacitor C4. The capacitors C13 and C15 of this filter serve to route the high frequency components of the rectified r.f. signal to ground. Thus the signal fed to the input terminal 51 of the comparator 50 is an essentially d.c. signal having a magnitude which is related to the total r.f. power which is fed to the circuit. In the illustrative embodiment shown, the maximum amplitude of this d.c. signal fed to terminal 51 of the comparator 50 is approximately 1 volt.

The reference voltage to the other leg 52 of the comparator 50 is provided by the circuitry associated with a Schottky diode CR23. The Schottky diode CR23 is similar to the Schottky diode CR11 so as to automatically compensate for variations in the response in CR11 caused, by example, temperature variations. An appropriate reference voltage corresponding to the total expected r.f. power input to circuitry may be selected by appropriate adjustment of the variable resistor R21. Good sensitivity is provided because the resistor R21 can be adjusted all the way down to provide to provide only the voltage across the Schottky diode CR23. Resistors R20 and R18 and capacitor C19 provides r.f. filtering and also serve to provide a load to input terminal 52 of the comparator 50 which is similar to the load connected to the input terminal 51. R24 provides hysteresis for the circuit. The R21 is adjusted so that during operation of the circuit, the voltage supplied to terminal 52 of the comparator 50 is higher than the voltage which is expected to be present at terminal 51. Under these conditions, the output 53 of the comparator is high (up to +15 volts) and this high voltage signal is fed to the switch 5 of FIG. 2 thereby keeping that switch closed and allowing r.f. signals to pass through switch 5 and be supplied to the laser. If, however, the total r.f. modulation causes the voltage at input terminal 51 of the comparator to become higher the voltage at input terminal 52, the comparator will switch and provide a ground at its output terminal 53. When this ground is supplied to switch 5, switch 5 will be caused to open, thereby removing the r.f. input signal from the laser 7.

As noted above, FIG. 3 shows a number of optional components which are not included in the presently preferred embodiment of the invention but which may, nevertheless, may be of interest. The resistor R40 connected between output terminal 53 of comparator 50 and its input terminal 52 may be used to provide hysteresis to the circuit so that the comparator does not switch back and forth when the voltages on input terminals 51 and 52 are close together in magnitude. In the presently preferred embodiment, however, the hysteresis provided by resistor R24 has been found to be sufficient and R40 is not necessary.

The capacitor C42 shown as being connected in parallel with the resistor R40 between terminals 53 and 52 may be used to prevent oscillation. Nevertheless, the presently preferred embodiment of the circuit has been found to be relatively immune from such oscillations without incorporating the capacitor 42 in the circuitry.

The optional circuitry comprising the variable resistor R44 connected in series with the resistor R45 which connects terminal 51 of the comparator 50 to ground is shown as a means for attenuating the level of the input signal into terminal 51 of the comparator 50 to bring that input signal within the operating range of the comparator circuit. Such a circuit might be useful, for example, if a very high level radio frequency input is provided to the comparator circuit. In the presently preferred embodiment this further attenuation was not found to be necessary, however. In this regard, it should be noted that another means for reducing the magnitude of the r.f. signal at pin 51 is to select a radio frequency tap 3 (see FIG. 2) with a higher level of attenuation.

If R44 and R45 are used, resistor R41 should also be connected to terminal 52 so as to balance the load seen by the respective input terminals of the comparator 53.

As noted earlier, a second function of the present invention is to detect loss of power to the laser and to disconnect the radio frequency input to the laser if such an event occurs so as to avoid damaging the laser. In the present embodiment, the laser is powered by a −15 volt power supply. This −15 volt power supply is connected to input pin 62 of comparator 60 through a zener diode CR29. The resistors R12 and R9 set up a bias voltage of +5 volts on the positive terminal 61 of comparator 60. Under these conditions, the output pin 63 of the comparator 60 is relatively high (approximately 15 volts) and this voltage is supplied to the switch 5 of FIG. 2 to keep the r.f. input connected to the laser 7. It will be noted that the output of pin 63 of comparator 60 and the output pin 53 of the comparator 50 are connected in a logical "Oring" relationship so that if the output of either comparator goes to ground this ground potential will be supplied to switch 5 thereby causing the switch 5 to open.

Returning to the circuitry associated with the comparator 60, if power from the −15 volt power supply is lost, terminal 62 is connected to the +15 volt supply through the resistor R28. With the −15 volt supply gone, therefore, pin 62 will go to +15 volts which is higher than the +5 volt supplied to input terminal 61. Under these conditions the output terminal 63 of comparator 60 goes to ground thereby causing switch 5 to disconnect the r.f. input signal from the laser 7.

While the principles of the present invention have been described above in conjunction with specific apparatus, it is to be clearly understood that this description is made only by way of example and not as a limitation to the scope of the invention which is defined by the appended claims.

We claim:

1. In a system for generating an amplitude modulated optical signal by applying a modulating signal to a laser device said laser device being supplied by a d.c. power means for biasing said modulation signal to a magnitude greater than the threshold of the laser device, apparatus for preventing excursions of said modulating signal below the threshold comprising:

means for detecting the power level of said modulating signal;

means responsive to said detecting means for generating a disconnect signal when the power level of the modulating signal exceeds a predetermined value; and a switch responsive to said disconnect signal for disconnecting said modulating signal from said laser device.

2. Apparatus in accordance with claim 1 wherein said power level detecting means comprises:

means for converting said modulating signal to a d.c. signal having an amplitude related to the power level of said modulating signal.

3. Apparatus in accordance with claim 2 wherein said power level detecting means further comprises means for substantially removing any a.c. component from said d.c. signal.

4. Apparatus in accordance with claim 3 wherein:
   said converting means is a rectifier and said removing means is a low pass filter.

5. Apparatus in accordance with claim 4 wherein:
   said rectifier comprises a Schottky diode.

6. In a system for generating an amplitude modulated optical signal by applying a modulating signal to a laser device said laser device being supplied by a d.c. power means for biasing said modulation signal to a magnitude greater than the threshold of the laser device, apparatus for preventing excursions of said modulating signal below the threshold comprising:

means for detecting the amplitude of said modulating signal;

means responsive to said detecting means for generating a disconnect signal when the amplitude of the modulating signal exceeds a predetermined value;

a switch responsive to said disconnect signal for disconnecting said modulating signal from said laser device; and means for detecting an excursion in the output of said biasing means below a predetermined value;

wherein said disconnect signal generating means is further responsive to said bias output excursion detecting means for generating said disconnect signal when the output of said biasing means falls below said predetermined value.

7. Apparatus in accordance with claim 6 wherein said bias output excursion detecting means comprises:

a comparator circuit including a first input terminal, a second input terminal, an output terminal; and means for grounding said output terminal when a signal applied to said first input terminal is greater than a signal applied to said second input terminal;

wherein the output of said biasing means is connected to said first input terminal.

8. Apparatus in accordance with claim 7 wherein:
   said biasing means is connected to said first input terminal through a Schottky diode.

9. Apparatus in accordance with claim 7 further comprising:

means connected to said second input terminal for generating a predetermined signal greater than the output of said biasing means.

10. In a system for generating an amplitude modulated optical signal by applying a modulating signal to a laser device said laser device being supplied by a d.c. power means for biasing said modulation signal to a magnitude greater than the threshold of the laser device, apparatus for preventing excursions of said modulating signal below the threshold comprising:

means for detecting the amplitude of said modulating signal including means for converting said modulating signal to a d.c. signal having an amplitude related to the amplitude of said modulating signal and means for substantially removing any a.c. component from said d.c. signal;

means responsive to said detecting means for generating a disconnect signal when the amplitude of the modulating signal exceeds a predetermined value including a comparator circuit having a first input terminal, a second input terminal, an output terminal, and means for grounding said output terminal when a signal on said first input terminal is greater than a signal on said second input terminal;

wherein said amplitude detecting means is connected to said first input terminal; and a switch responsive to said disconnect signal for disconnecting said modulating signal from said laser device.

11. Apparatus in accordance with claim 10 further comprising:

means connected to said second input terminal for generating a d.c. signal having a predetermined amplitude.

12. Apparatus in accordance with claim 11 further comprising:

means for balancing the loads on said first input terminal and said second input terminal.

13. Apparatus in accordance with claim 11 wherein:
    said d.c. signal generating means includes means for compensating for variations in the magnitude of the d.c. signal output of said converting means caused by variations in temperature.

14. Apparatus in accordance with claim 10 further comprising:

a second comparator circuit including a first input terminal connected to said d.c. power means, a second input terminal, an output terminal connected to the output terminal of said first comparator terminal of said first comparator circuit; and means for grounding said output terminal when a signal applied to said first input terminal is greater than a signal supplied to said second input terminal.

15. Apparatus in accordance with claim 14 further comprising:

means connected to said second input terminal of said second comparator circuit for generating a predetermined signal greater than the normal output voltage of said d.c. power means.

16. In a system for generating an amplitude modulated optical signal by applying a modulating signal to a laser device said laser device being supplied by a d.c. power means for biasing said modulation signal to a magnitude greater than the threshold of the laser device, apparatus for preventing excursions of said modulating signal below the threshold comprising:

means for detecting the power level of said modulating signal;

means responsive to said detecting means for generating a disconnect signal when the power level of the modulating signal exceeds a predetermined value;

a switch responsive to said disconnect signal for disconnecting said modulating signal from said laser device; and means for detecting an excursion in the output of said biasing means below a predetermined value;

wherein said disconnect signal generating means is further responsive to said bias output excursion detecting means for generating said disconnect signal when the output of said biasing means falls below said predetermined value.

17. In a system for generating an amplitude modulated optical signal by applying a modulating signal to a laser device said laser device being supplied by a d.c. power means for biasing said modulation signal to a magnitude greater than the threshold of the laser device, apparatus for preventing excursions of said modulating signal below the threshold comprising:

means for detecting the power level of said modulating signal including means for converting said modulating signal to a d.c. signal having an amplitude related to the power level of said modulating signal and means for substantially removing any a.c. component from said d.c. signal;

means responsive to said detecting means for generating a disconnect signal when the amplitude of the modulating signal exceeds a predetermined value including a comparative circuit having a first input terminal, a second input terminal, an output terminal, and means for grounding said output terminal when a signal on said first input terminal is greater than a signal on said second input terminal;

wherein said power level detecting means is connected to said first input terminal; and a switch responsive to said disconnect signal for disconnecting said modulating signal from said laser device.

* * * * *